(12) United States Patent
Li et al.

(10) Patent No.: US 9,646,946 B2
(45) Date of Patent: May 9, 2017

(54) FAN-OUT WAFER-LEVEL PACKAGING USING METAL FOIL LAMINATION

(71) Applicant: Invensas Corporation, San Jose, CA (US)

(72) Inventors: Xuan Li, Santa Clara, CA (US); Rajesh Katkar, San Jose, CA (US); Long Huynh, Santa Clara, CA (US); Laura Wills Mirkarimi, Sunol, CA (US); Bongsub Lee, Mountain View, CA (US); Gabriel Z. Guevara, San Jose, CA (US); Tu Tam Vu, San Jose, CA (US); Kyong-Mo Bang, Fremont, CA (US); Akash Agrawal, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/877,205

(22) Filed: Oct. 7, 2015

(65) Prior Publication Data
US 2017/0103957 A1    Apr. 13, 2017

(51) Int. Cl.
*H01L 23/48* (2006.01)
*H01L 29/40* (2006.01)
(Continued)

(52) U.S. Cl.
CPC ........ *H01L 24/14* (2013.01); *H01L 21/02118* (2013.01); *H01L 21/304* (2013.01); *H01L 21/565* (2013.01); *H01L 21/6835* (2013.01); *H01L 21/76838* (2013.01); *H01L 23/293* (2013.01); *H01L 23/5384* (2013.01);
(Continued)

(58) Field of Classification Search
CPC . H01L 2224/02377; H01L 2224/02379; H01L 21/76208; H01L 2224/80856; H01L 23/5226; H01L 2224/84; H01L 2924/181; H01L 2224/12105; H01L 2924/0665; H01L 24/16; H01L 23/49833; H01L 23/5386; H01L 24/43; H01L 21/565; H01L 24/14; H01L 21/563
See application file for complete search history.

(56) References Cited

U.S. PATENT DOCUMENTS 6,965,160 B2    11/2005    Cobbley et al.
7,662,667 B2 *   2/2010    Shen ............... H01L 21/568
                                                        438/112
(Continued)

*Primary Examiner* — Jasmine Clark

(57) ABSTRACT

Fan-out wafer-level packaging (WLP) using metal foil lamination is provided. An example wafer-level package incorporates a metal foil, such as copper (Cu), to relocate bonding pads in lieu of a conventional deposited or plated RDL. A polymer such as an epoxy layer adheres the metal foil to the package creating conductive contacts between the metal foil and metal pillars of a die. The metal foil may be patterned at different stages of a fabrication process. An example wafer-level package with metal foil provides relatively inexpensive electroplating-free traces that replace expensive RDL processes. Example techniques can reduce interfacial stress at fan-out areas to enhance package reliability, and enable smaller chips to be used. The metal foil provides improved fidelity of high frequency signals. The metal foil can be bonded to metallic pillar bumps before molding, resulting in less impact on the mold material.

6 Claims, 13 Drawing Sheets

(51) Int. Cl.
  *H01L 21/84*     (2006.01)
  *H01L 23/00*     (2006.01)
  *H01L 21/02*     (2006.01)
  *H01L 21/683*    (2006.01)
  *H01L 21/768*    (2006.01)
  *H01L 21/56*     (2006.01)
  *H01L 21/304*    (2006.01)
  *H01L 23/538*    (2006.01)
  *H01L 23/29*     (2006.01)

(52) U.S. Cl.
  CPC .... *H01L 24/81* (2013.01); *H01L 2224/81005* (2013.01); *H01L 2224/8185* (2013.01)

(56) References Cited

U.S. PATENT DOCUMENTS

| | | |
|---|---|---|
| 8,101,470 B2 | 1/2012 | Poddar et al. |
| 8,487,194 B2 | 7/2013 | Tuominen et al. |
| 9,000,600 B2 | 4/2015 | Uzoh et al. |
| 9,035,461 B2 | 5/2015 | Hu et al. |
| 9,059,181 B2 | 6/2015 | Chen et al. |
| 9,059,304 B2 | 6/2015 | Meyer et al. |
| 2011/0037163 A1* | 2/2011 | Lachner ................ H01L 21/561 257/693 |
| 2014/0213020 A1 | 7/2014 | Crane et al. |
| 2014/0252573 A1 | 9/2014 | Lin et al. |
| 2015/0076714 A1 | 3/2015 | Haba et al. |
| 2015/0145140 A1 | 5/2015 | Haba et al. |

\* cited by examiner

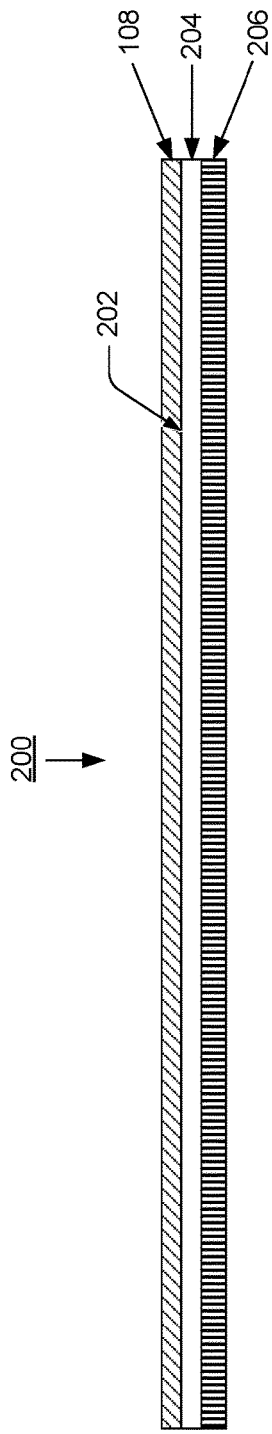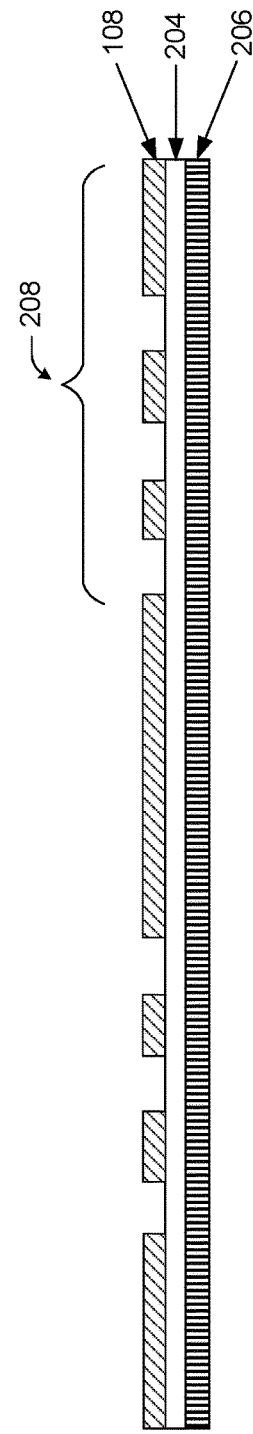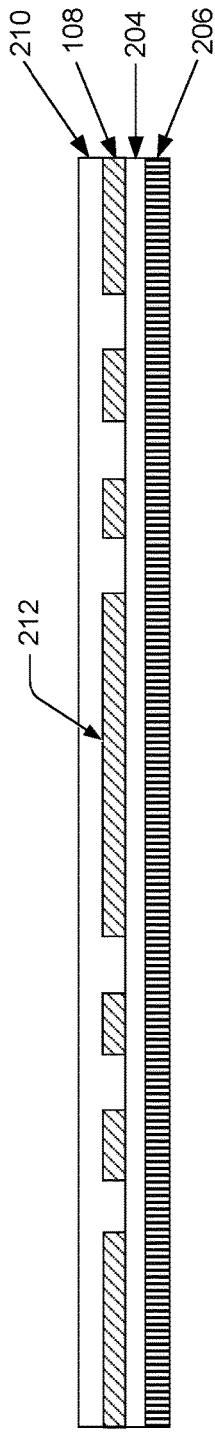

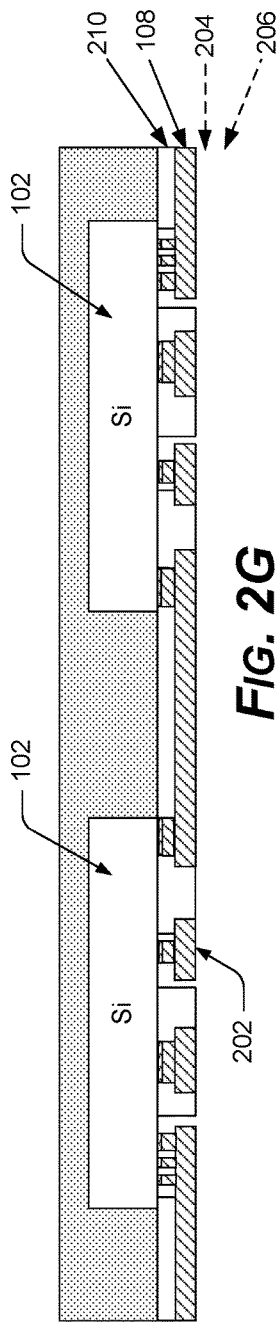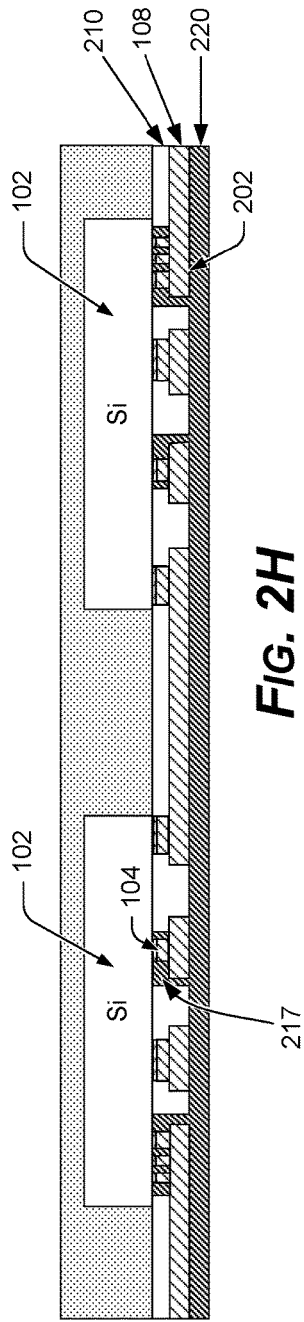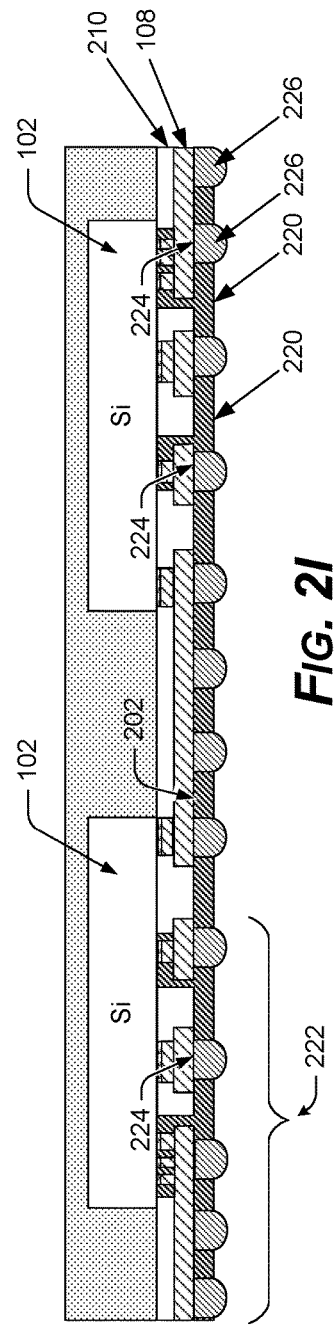

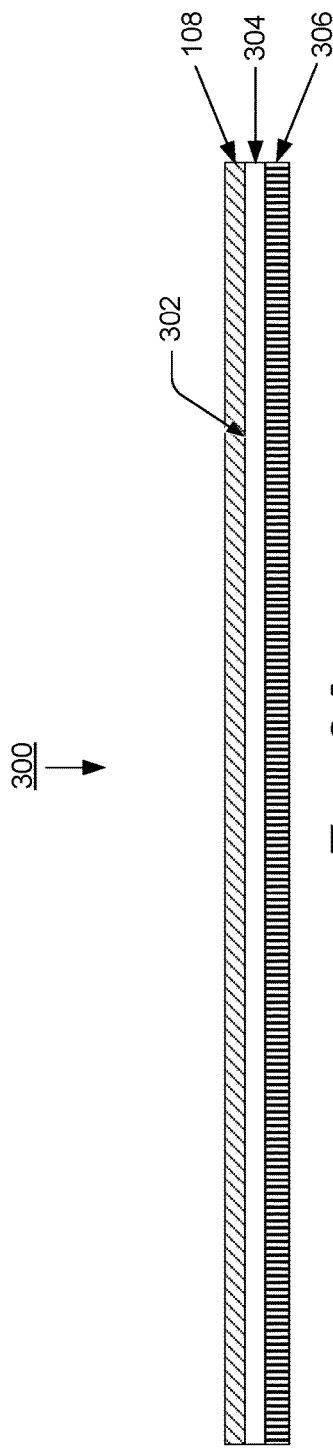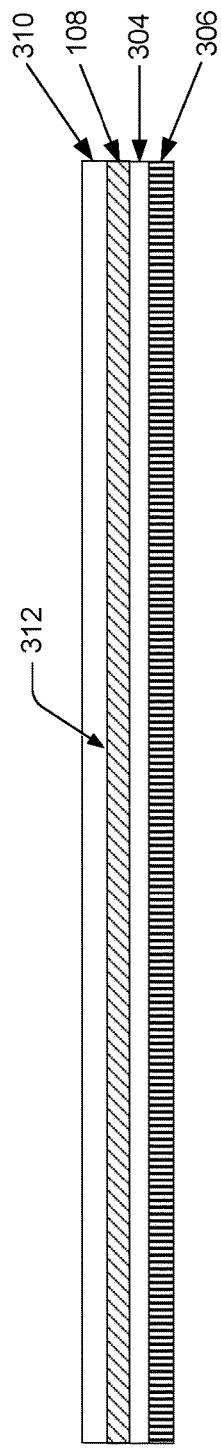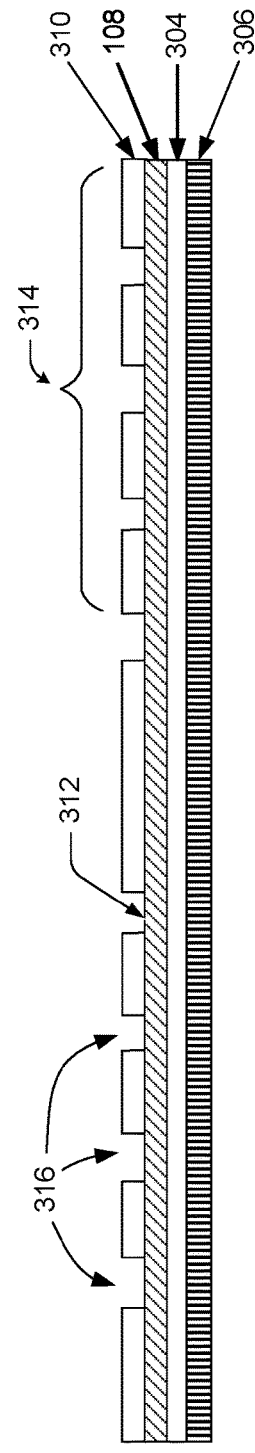

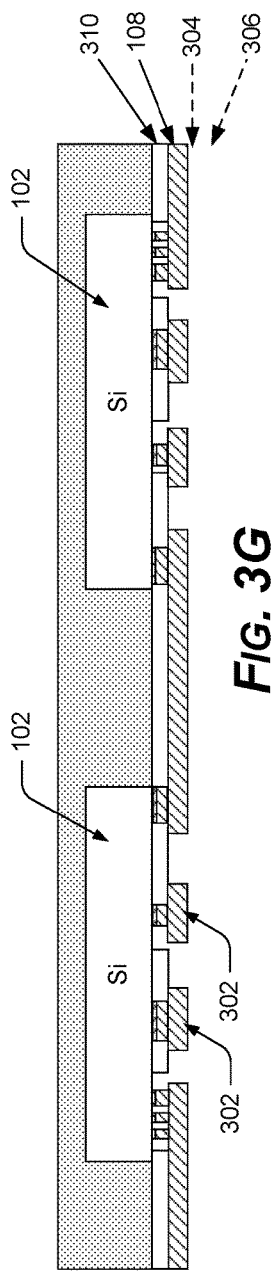
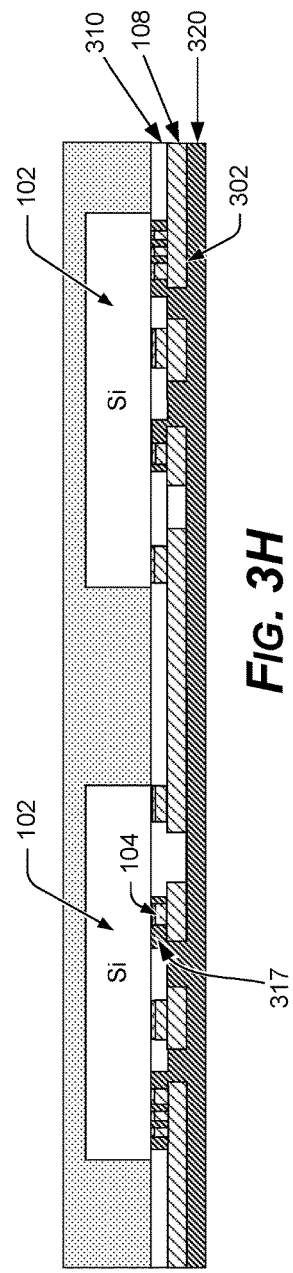
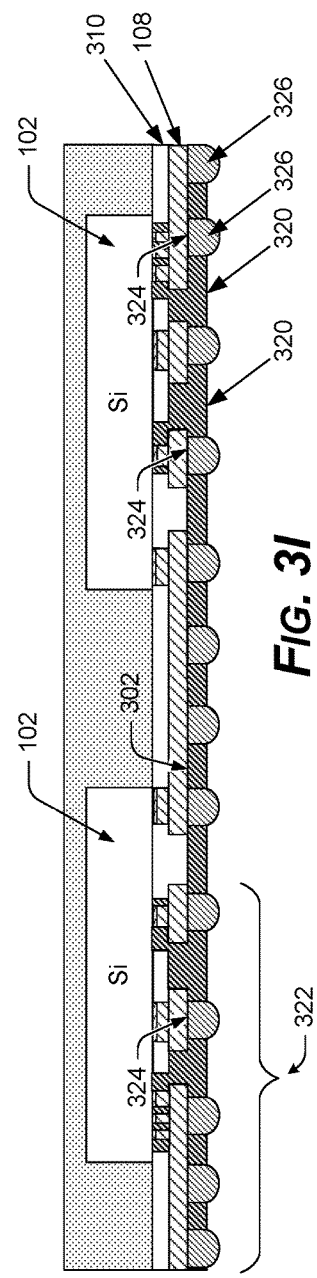

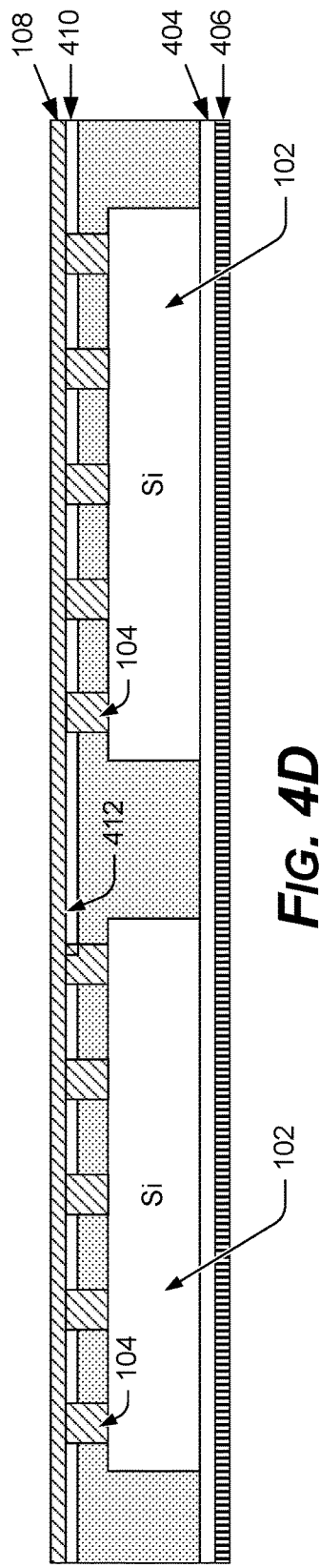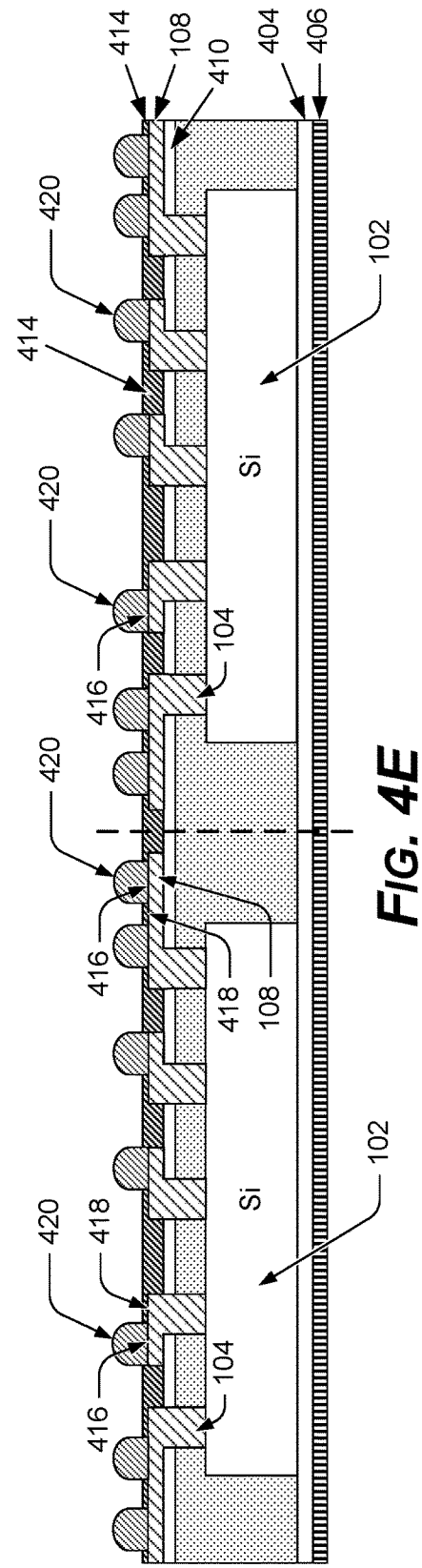

FAN-OUT WAFER-LEVEL PACKAGING USING METAL FOIL LAMINATION

BACKGROUND

A redistribution layer (RDL) is an important feature in high density chip packaging. Conventional RDLs can relocate integrated circuit bond pads before flip chip bumping, for example, offering a feasible and low cost method to distribute power and grounding contacts. RDLs also redistribute wafer-level chip-scale packages to ball-grid arrays for external connection. Moreover, 3D packaging and system-in-package modules often depend heavily on redistributed bond pads.

Conventional RDL processes have their drawbacks. Laying down RDL conductors is relatively expensive and time consuming as several metals are deposited in a sequence of thin layers over a passivation layer on the wafer surface. Multiple metals are required to provide adhesion, barrier strength, electrical conduction, and protection. Layers of various metals including but not limited to copper, aluminum, gold, titanium, nickel, etc., may be deposited as conductive trace lines for relocating the bond pads. The deposited metals form a conduction pattern that may vary in thickness at different locations. These variations in thickness can cause high frequency signal transmission loss. Moreover, in the case of fan-out wafer level packaging (FOWLP), conventional RDL overlies the transition of fan-in and fan-out boundary areas, where there is large interface stress caused by mismatched coefficients of thermal expansion (CTE) of silicon and encapsulation mold compound.

SUMMARY

A FOWLP process using metal foil lamination without using a conventional RDL deposition process is provided. An example method includes adhering a metal foil to a carrier with an adhesive, covering the metal foil with a layer of polymer, creating holes in the polymer layer for mounting metal pillars or pads of an integrated circuit die to the metal foil, connecting the metal pillars or pads to the metal foil, removing the carrier and the adhesive to reveal the metal foil, etching the metal foil into redistribution traces, applying a compliant polymer layer over the metal foil, and exposing parts of the metal foil through the compliant polymer layer to be used as conductive contacts.

An example wafer-level package includes an integrated circuit die including metallic pillars, at least a layer of a B-stage material occupying at least part of a volume between the metallic pillars of the integrated circuit die, a metal foil adhered by the B-stage material to the integrated circuit die or to a mold material of the wafer-level package, the metal foil held in conductive contact with the metallic pillars of the integrated circuit die by the B-stage material, and the metal foil etched in a pattern to create metal traces for relocating conductive contacts fanned-out from the metallic pillars, in lieu of an RDL process.

The metal foil may be patterned at different stages of a fabrication process. An example wafer-level package with metal foil provides relatively inexpensive electroplating-free traces that replace expensive RDL processes. Example techniques can reduce interfacial stress at fan-out areas to enhance package reliability, and enable smaller chips to be used. The consistency of the metal foil provides improved fidelity of high frequency signals. The bonding of the metal foil to metallic pillars can be accomplished before molding, resulting in less impact on the mold material.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood however, that the accompanying figures illustrate the various implementations described herein and are not meant to limit the scope of various technologies described herein.

FIGS. 2A-2I are diagrams of an example fabrication process in which the metal foil is patterned early in the example process.

FIGS. 3A-3I are diagrams of an example fabrication process in which the metal foil is patterned late in the example process.

FIGS. 4A-4E are diagrams of an example fabrication process using a backside mount on a chip carrier.

DETAILED DESCRIPTION

Overview

This disclosure describes fan-out wafer-level packaging (FOWLP) using metal foil lamination without a conventional RDL deposition process. In various implementations, a wafer-level package is fabricated by incorporating a lamination of a metal foil, such as copper (Cu) or aluminum (Al), as opposed to deposition of conventional RDL conductors. Compared to conventional techniques, an example wafer-level package as described herein provides relatively inexpensive electroplating-free conductor traces, which replace the deposited conductors of expensive RDL deposition processes. The example metal foil lamination techniques can improve adhesion between, for example, copper traces and the mold, and can also reduce the interfacial stress at fan-in and fan-out areas to enhance the package reliability.

The example metal foil lamination techniques can enable use of smaller chips, because the area of bonding between metal pillars and the metal foil can be less than that needed for conventional RDL processes. These features can be used to create smaller packages. The uniform thickness of the metal foil also enables improved fidelity of high frequency signals. In an implementation, the bonding of the metal foil to metallic pillar bumps can be performed before a molding process is complete, resulting in less impact on the mold material and higher reliability as compared with conventional RDL techniques. The term "metal pillars" is used herein to represent metallic pillars, stud bumps, BOND-VIA-ARRAY (BVA) connections, and so forth (trademark: Invensas Corp, San Jose, Calif.). Mechanical stress buffers of polyimide or another compliant polymer or dielectric around die pads and pillars can be provided by the example techniques and the size of such stress buffers can be increased in size to provide high reliability in smaller wafer-level packages using smaller chips.

Example Wafer-Level Packages and Techniques

In the following description, numerous details are set forth to provide an understanding of some embodiments of the present disclosure. However, it will be understood by those of ordinary skill in the art that the system and/or methodology may be practiced without these details and that numerous variations or modifications from the described embodiments may be possible.

Figure 1:
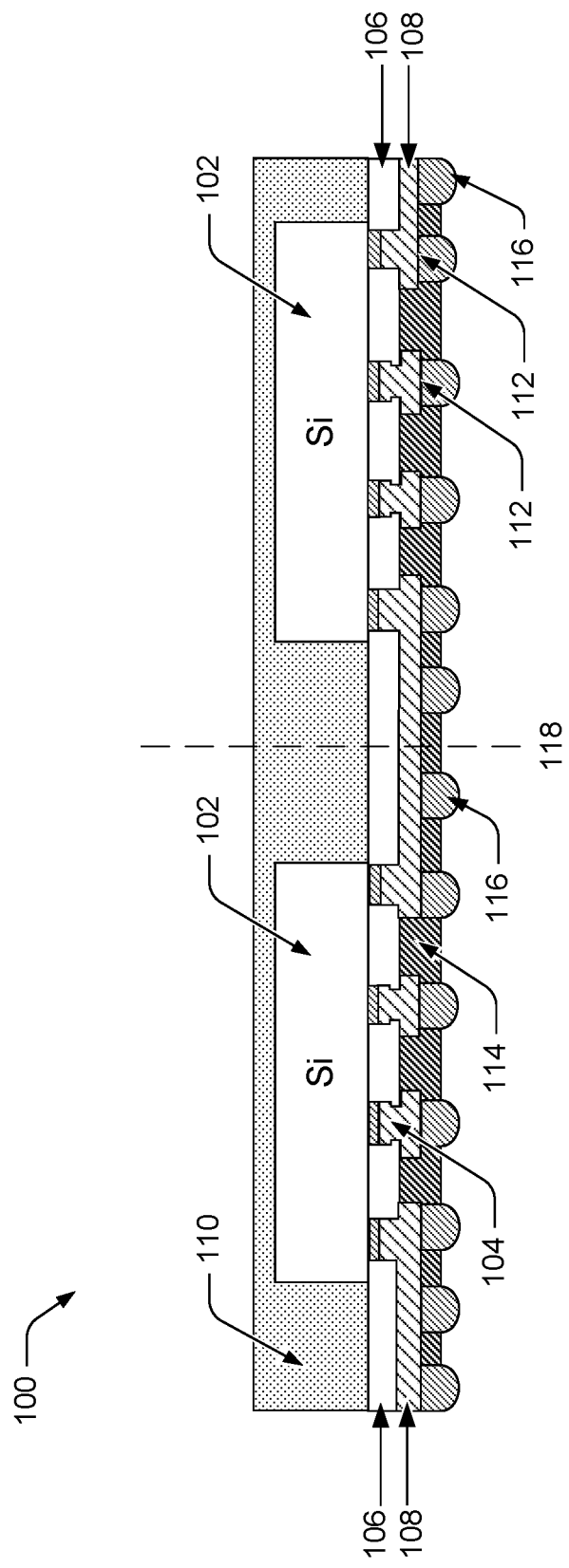
FIG. 1 is a diagram of an example wafer-level package using a metal foil for fan-out of bonding pads, fabricated by the example processes described herein.

FIG. 1 shows an example wafer-level package 100 fabricated by the example processes described herein. The example wafer-level package 100 includes at least one integrated circuit die 102 including metallic pillars 104. At least a polymer layer 106, such as a B-stage epoxy for example, occupies at least part of the volume between the metallic pillars 104 of the integrated circuit die 102. A metal foil 108 is adhered by the polymer layer 106 to the integrated circuit die 102 or to a mold material 110 of the wafer-level package 100. The metal foil 108 is held in conductive contact with the metallic pillars 104 of the integrated circuit die 102 by the polymer layer 106 adhering the metal foil 108 to the wafer-level package 100. The metal foil 108 is etched in a pattern to create metal traces for relocating conductive contacts 112 fanned-out or fanned-in from the metallic pillars 104, in lieu of a conventional RDL deposition process. Another dielectric or compliant polymer layer 114, e.g. polyimide material, may cover the etched and patterned metal foil 108. This compliant polymer layer 114 may be composed of polyimide, or another compliant polymer or dielectric with a Young's Modulus or tensile modulus less than 4.0 GPa (gigapascals), for example.

Lithography applied to such a compliant polymer layer 114 exposes the conductive contacts 112, to which conductive bumps 116 may be added. The wafer-level package 100 is then diced 118 into singulated package units.

In an implementation, the metal foil 108 can be copper (Cu), aluminum (Al), etc., or a single metal laminate sheet of a metal or alloy. The polymer layer 106 may be a compliant epoxy to reduce interface stress between the metallic pillars 104 and a mold material 110 of the wafer-level package 100 at a fan-out or fan-in boundary of the wafer-level package 100.

Example wafer-level fabrication processes include selecting the integrated circuit die 102, including metallic pillars 104, for a wafer-level package 100, creating at least a layer 106 of a B-stage material to occupy at least part of a volume in-between the metallic pillars 104 of the integrated circuit die 102, and creating an adhesion interface between the B-stage material 106 and the metal foil 108. The adhesion interface causes the metal foil 108 to conductively contact the metallic pillars 104. The conductive contacts may optionally be bonded by annealing, solder reflow, thermal compression, and so forth. The example processes include patterning the metal foil 108 to create metal traces for distributing conductive contacts 112 to be fanned out from the metallic pillars 104 in lieu of an RDL deposition process.

An example process may include annealing the conductive contacts between the metallic pillars 104 and the metal foil 108 into more complete metallic bonds between the metal surfaces. For example, at the area of contact between a copper metal pillar 104 and a copper metal foil 108, a physical interface may be created between the metallic crystal lattice structure of the copper metal in the metal pillar 104 and the metallic crystal lattice structure of the copper metal in the copper metal foil 108.

There are various ways of annealing this physical interface into a single metallic crystal lattice structure that provides improved conduction of signals back and forth between the metallic pillar 104 and the metal foil 108. For example, in the case of copper, applying heat at a temperature greater than 150° C. for 30 minutes begins to fuse the interface between metallic pillar 104 and metal foil 108. Applying heat at 180° C. for 30 minutes can completely fuse the interface between metallic pillar 104 and metal foil 108 into a single bonded connection. Pressure can also be used instead of heat or as an adjunct to heat to improve the electrical contact between the metal foil 108 and the metallic pillars 104 of the integrated circuit die 102.

In one example, the conductive contact between metal pillars 104 and pad on the foil 108 may be accomplished using reflow compatible materials, e.g. solder or its composites. In another example, such contact may be formed during a reflow process. In another example, such contact may be formed using a thermal compression bonding process, for example a Sn—Cu (tin to copper) thermal compression bond.

FIGS. 2A-2I show an example fabrication process 200 in which the metal foil 108 is etched early in the example process 200, for example, to create the contact pads. Further processing to create under bump metallization (UBM), for example, can also be completed.

In FIG. 2A, a first side 202 of the metal foil 108 is attached to an adhesive layer 204 (not to scale) of a carrier 206. In one example, commercially available products with thin metal foil 108 attached to a thicker carrier foil 206 using adhesive 204 can also be used.

In FIG. 2B, the metal foil 108 is patterned 208, for example by etching.

In FIG. 2C, a polymer layer 210 is coated over the second side 212 of the (patterned) metal foil 108. The polymer layer 210 may be spun-on as a B-stage thin epoxy film, for example.

Figure 2D:
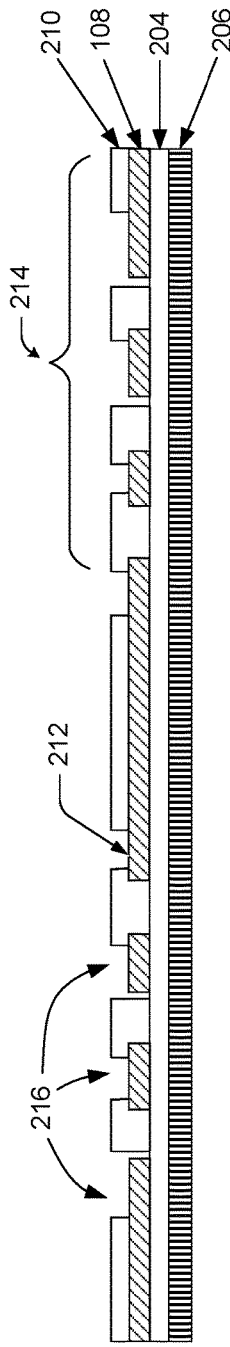

In FIG. 2D, lithography is applied to the polymer layer 210 or B-stage epoxy film, to create a patterned polymer layer 214 or patterned B-stage epoxy film with one or more holes 216 exposing the second side 212 of the (patterned) metal foil 108 in a pattern approximating a layout of the metallic pillars 104. There may be just one hole 216 or a plurality of holes in the polymer layer 210. Holes 216 may be circular, oval, square, rectangular or numerous other shapes.

The holes 216 may provide voids of predetermined size to occur around the metallic pillars 104 when the die 102 is attached.

Figure 2E:
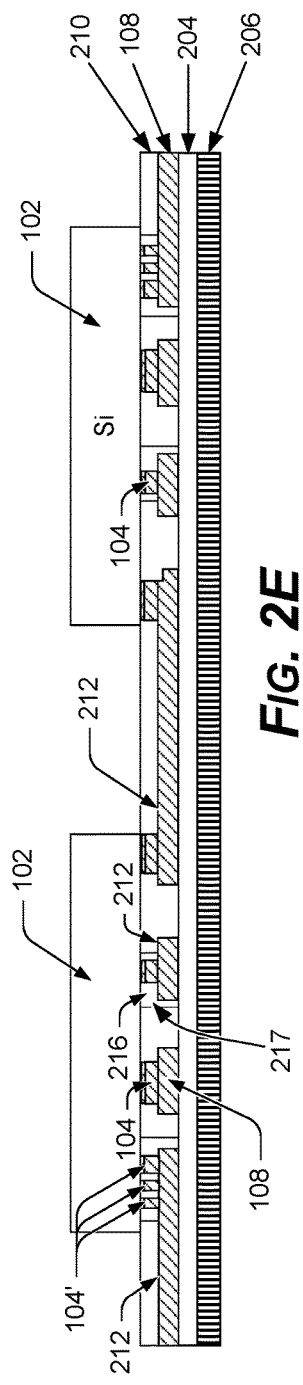

In FIG. 2E, an integrated circuit die 102 is adhered to the patterned polymer layer 214 or B-stage epoxy film, causing the metallic pillars 104 to contact the second side 212 of the metal foil 108 through the holes 216. In one example, one or more metallic pillars 104 may bond to the second side 212 of the metal foil 108 through one or more holes. This may create a void or gap 217 between vertical sidewalls of the holes 216 and vertical sidewalls of the pillars 104 (see also FIG. 6). In another example, a plurality of the pillars 104' make a contact with a single contact pad formed on the second side 212 of the metal foil 108.

Figure 2F:
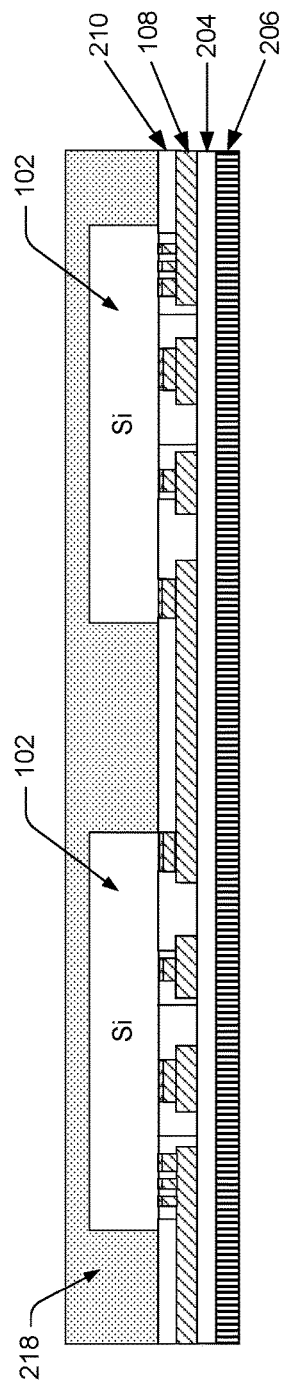

In FIG. 2F, a mold material 218 is applied over the integrated circuit die 102 and over the polymer layer 210 or B-stage epoxy film to encapsulate these.

In FIG. 2G, the adhesive layer 204 and the carrier 206 are removed, exposing the first side 202 of the (patterned) metal foil 108 and the polymer layer 210 or B-stage epoxy film.

In FIG. 2H, a compliant polymer layer 220, such as a polyimide layer or other polymer or dielectric, is applied by spin-coating, for example, on the first side 202 of the patterned metal foil 108 and the intervening polymer layer 210 or B-stage epoxy film. This compliant polymer layer 220 may be composed of polyimide, or another compliant polymer or dielectric with a Young's Modulus or tensile modulus less than 4.0 GPa, for example. In an implementation, the compliant polymer layer 220 additionally fills at least part of voids 217 around the metallic pillars 104 and provides a partial or complete ring or cylinder of mechanical stress buffer around at least a part of one or more metallic pillars 104 or one or more die pads of the metallic pillar 104. The compliant polymer layer 220 is in contact with at least some part of the vertical sidewall of the metallic pillar 104.

In FIG. 2I, lithography is applied to the compliant polymer layer 220 to expose a pattern 222 of conductive contacts 224 on the first side 202 of the metal foil 108. The conductive contacts 224 are used as bonding pads. The exposed conductive contacts 224 may be bumped with conductive interconnects 226 on the exposed bonding pads. For example, various solder interconnects can be placed on the exposed conductive contacts 224, such as solder spheres, flip chip solder bumps, BGA solder balls, and tall columnar solder connections with or without a flux coating or solder paste deposition. Other wired, foil, or package-on-package connections and vias can also be connected or originated at the exposed conductive contacts 224.

FIGS. 3A-3I show an example fabrication process 300 in which the metal foil 108 is etched relatively late in the example process 300.

In FIG. 3A, a first side 302 of the metal foil 108 is attached to an adhesive layer 304 of a carrier 306. Likewise, a commercially available product with a thin metal foil 108 attached to a thicker carrier foil 306 using an adhesive 304 can also be used.

In FIG. 3B, a polymer layer 310 is coated over the second side 312 of the metal foil 108. The polymer layer 310 may be spun-on as a B-stage thin epoxy film, for example.

In FIG. 3C, lithography is applied to the polymer layer 310 or B-stage epoxy film, to create a patterned polymer layer 314 or patterned B-stage epoxy film with holes 316 exposing the second side 312 of the metal foil 108 in a pattern approximating a layout of the metallic pillars 104. The holes 316 may provide voids of predetermined size to occur around the metallic pillars 104 when the die 102 is attached. The holes 316 in polymer layer 310 may be circular, square, rectangular or numerous other shapes.

Figure 3D:
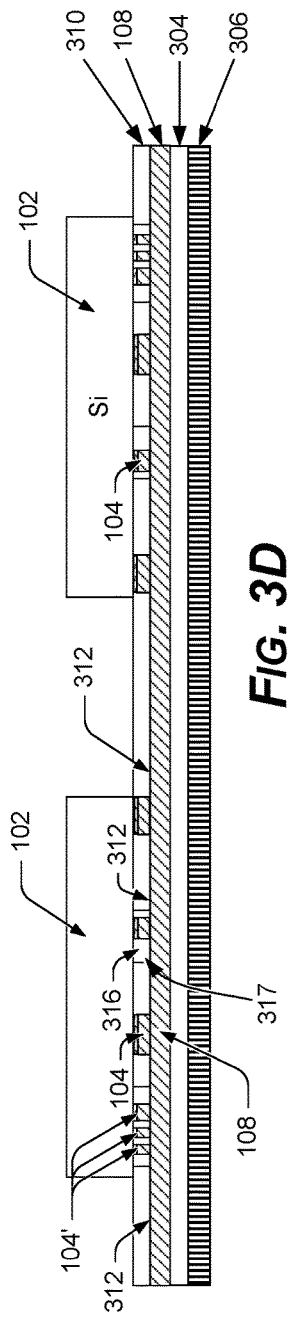

In FIG. 3D, the integrated circuit die 102 is adhered to the patterned polymer layer 310 or B-stage epoxy film, causing the metallic pillars 104 to bond to the second side 312 of the metal foil 108 through the holes 316 (of FIG. 3C). There may be just one hole 316 or a plurality of holes 316 in the polymer layer 310. In one example, one or more metallic pillars 104' may bond to the second side 312 of the metal foil 108 through one or more of the holes 316.

Figure 3E:
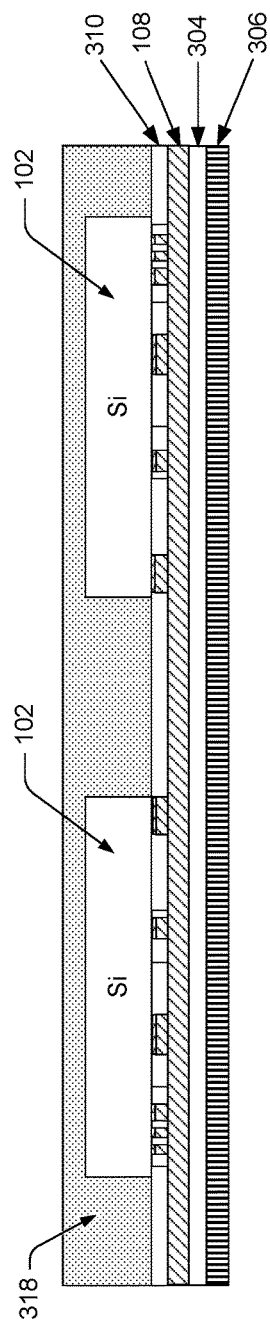

In FIG. 3E, a mold material 318 is applied over the integrated circuit die 102 and the polymer layer 310 or B-stage epoxy film to encapsulate this side of the wafer-level package.

Figure 3F:
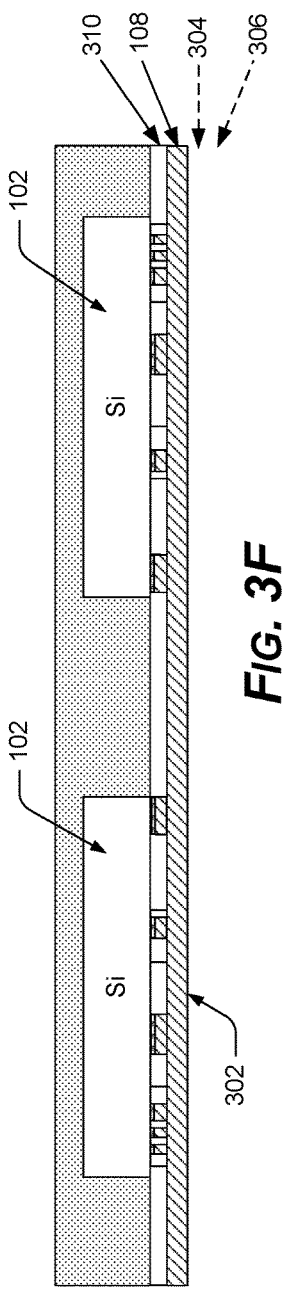

In FIG. 3F, the adhesive layer 304 and the carrier 306 are removed, exposing the first side 302 of the metal foil 108.

In FIG. 3G, the metal foil 108 is patterned 308 into an under bump metallization (UBM) pattern, for example, by an etching process.

In FIG. 3H, a compliant polymer layer 320, such a polyimide or another polymer, is applied by spin-coating, for example, on the first side 302 of the patterned metal foil 108 and on the intervening polymer layer 310 or B-stage epoxy film. This compliant polymer layer 320 may be composed of polyimide, or another compliant polymer or dielectric with a Young's Modulus or tensile modulus, for example, less than 4.0 GPa. In an implementation, the compliant polymer layer 320 additionally fills at least part of voids 317 around the metallic pillars 104 and 104', where the compliant polymer 220 in the voids 317 provides a partial or complete ring or cylinder of mechanical stress buffer around at least a part of one or more metallic pillars 104. Compliant polymer layer 320 is in contact with at least some part of the vertical sidewall of the metallic pillar 104.

In FIG. 3I, lithography may be applied to the compliant polymer layer 320 to expose a pattern 322 of conductive contacts 324 on the first side 302 of the metal foil 108. The conductive contacts 324 may be used as bonding pads. The exposed conductive contacts 324 may be bumped with conductive interconnects 326 on the exposed bonding pads. For example, various solder interconnects can be placed on the exposed conductive contacts 324, such as solder spheres, flip chip solder bumps, BGA solder balls, and tall columnar solder connections with or without a flux coating or solder paste deposition. Other wired, foil, or package-on-package connections and vias can also be connected or originated at the exposed conductive contacts 324.

In FIGS. 4A-4E, an example fabrication process 400 uses a backside mounted carrier.

Figure 4A:
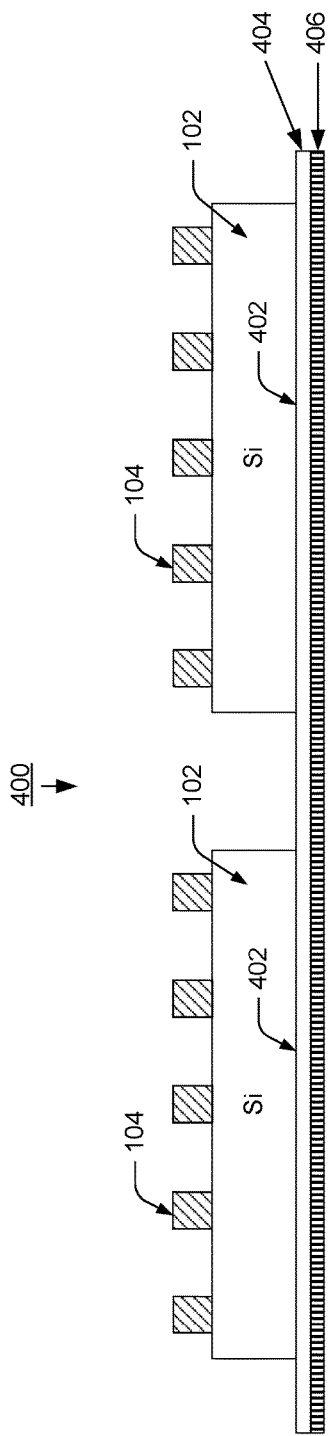

In FIG. 4A, backsides 402 of one or more integrated circuit dies 102 are adhered to a laminate film 404 on a carrier 406. Each integrated circuit die 102 may have metallic pillars 104, stub bumps, BVA connections, or the like.

Figure 4B:
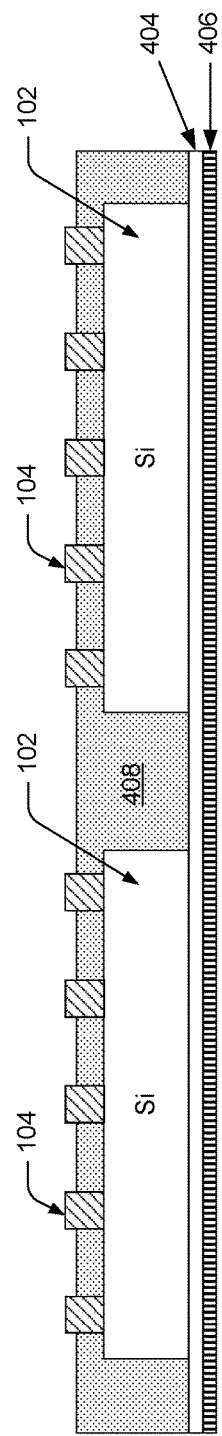

In FIG. 4B, a mold material 408 is applied, e.g., via film assist molding, around the integrated circuit die 102 and over the carrier 406 and laminate film 404 to encase the integrated circuit die 102 over the carrier 406, while leaving protrusions of the metallic pillars 104 above the mold material 408.

Figure 4C:
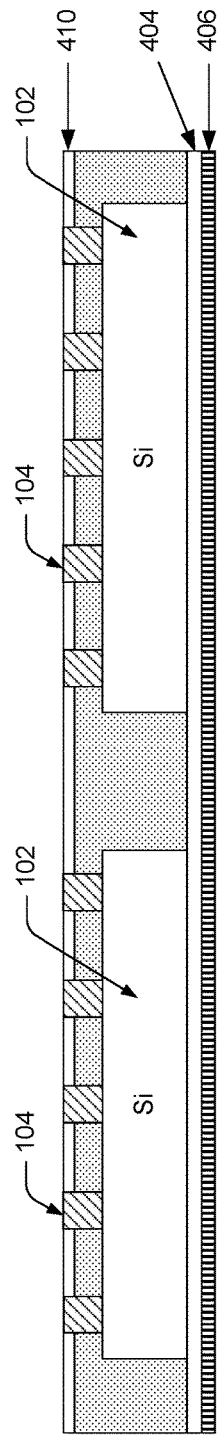

In FIG. 4C, a polymer layer 410, such as a spin-on material, for example BCB, is applied over the protrusions of the metallic pillars 104 and the mold material 408. Grinding back the polymer layer 410 exposes a surface of the metallic pillars 104.

In FIG. 4D, a first side 412 of the metal foil 108 is applied onto the polymer layer 410, the metal foil 108 making conductive contacts with the metallic pillars 104.

In FIG. 4E, the metal foil 108 is patterned and a compliant polymer layer 414, such as polyimide or another polymer, is applied over the patterned metal foil 108. Lithography is applied to the compliant polymer layer 414 to expose a pattern of conductive contacts 416 on a second side 418 of the (patterned) metal foil 108. The pattern of conductive contacts 416 can be used as bonding pads 416. Conductive bumps 420 can be connected to the bonding pads 416 as interconnects on the exposed bonding pads 416. For example, various solder interconnects can be placed on the exposed conductive contacts 416, such as solder spheres, flip chip solder bumps, BGA solder balls, and tall columnar solder connections with or without a flux coating or solder paste deposition. Other wired, foil, or package-on-package connections and vias can also be connected or originated at the exposed conductive contacts 416.

Figure 5A:
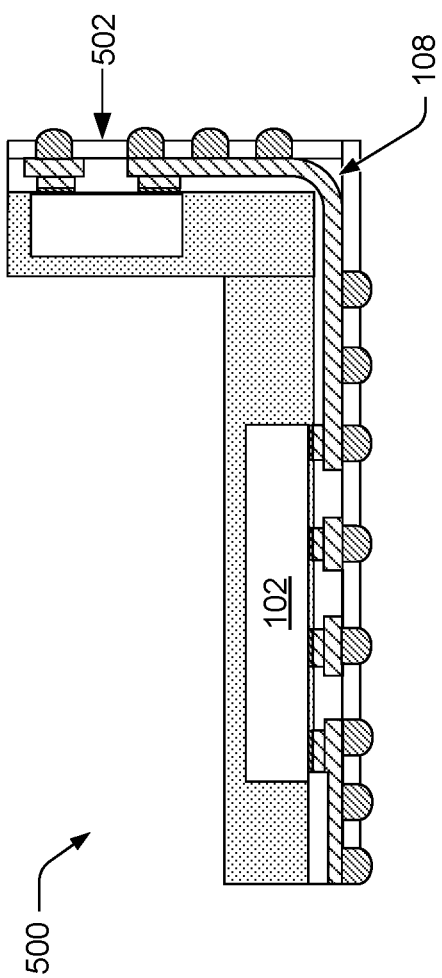
FIG. 5A is a diagram of an example wafer-level package in which the metal foil folds onto a perpendicular plane of the wafer-level package.

FIG. 5A shows an example wafer-level package 500 in which a continuous sheet of the metal foil 108 is folded from a first surface 502 to service a perpendicular surface 504 with respect to the first surface 502, in the wafer-level package 500. Thus, the metal foil 108 folds or curves onto a perpendicular plane of the wafer-level package 500.

Figure 5B:
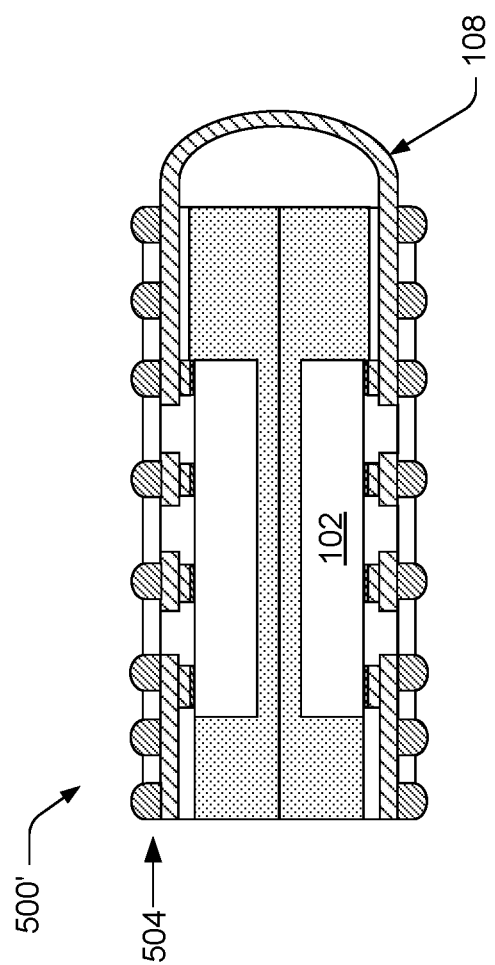
FIG. 5B is a diagram of an example wafer-level package in which the metal foil continues in a curve or fold onto a second additional surface, such as an additional parallel surface of the wafer-level package.

FIG. 5B shows an example wafer-level package 500' in which a continuous sheet of the metal foil 108 continues by folding or curving from a first surface 502 onto an additional surface 506 of the example wafer-level package 500'. The additional surface 506 may be parallel, for example, to the first surface 502 of the wafer-level package 500. Thus, the metal foil 108 folds or curves onto a parallel plane of the wafer-level package 500'.

Figure 6:
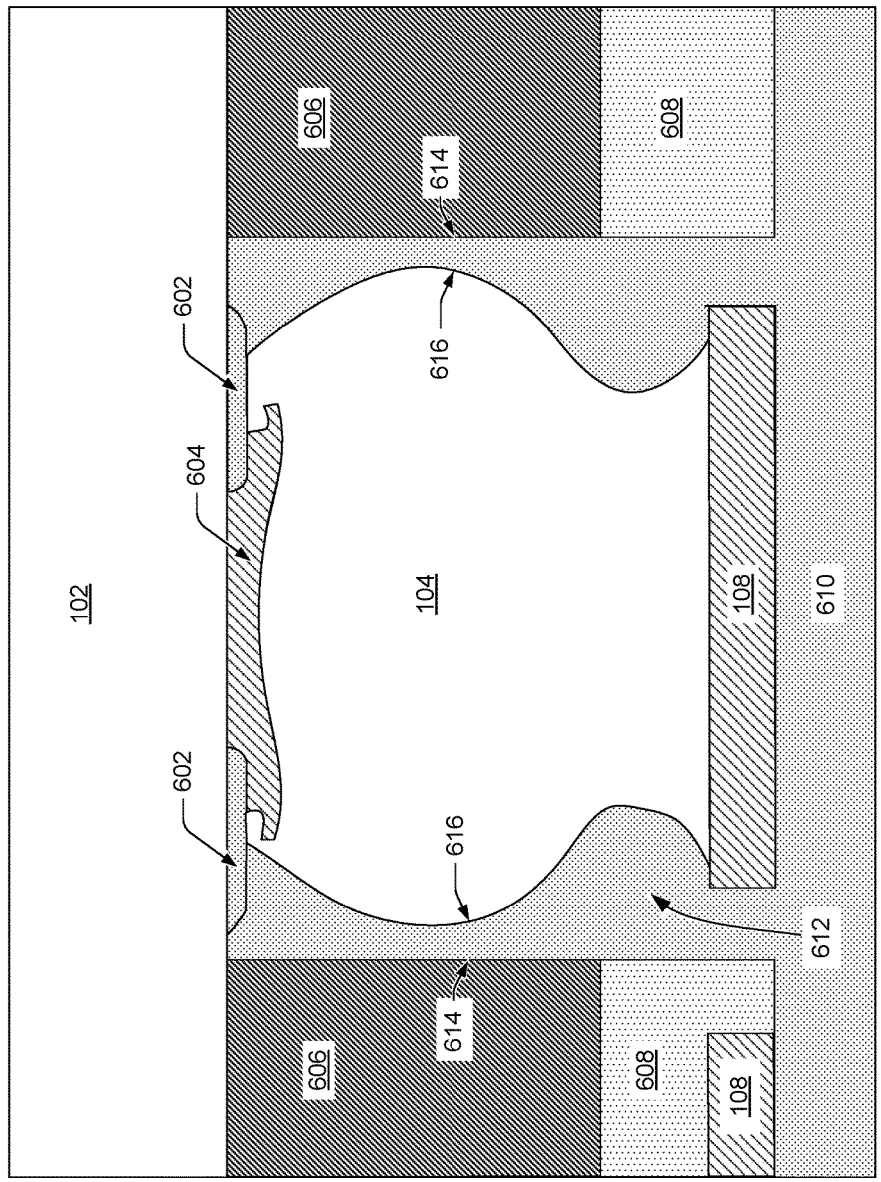
FIG. 6 is a diagram of an example metallic pillar of an integrated circuit die, in which a ring or cylinder of compliant polymer or dielectric surrounds at least part of a metal pillar to provide cushioning between the metal pillar and sidewalls of a hole or channel.

FIG. 6 shows an example metallic pillar 104 connected to an integrated circuit die 102, in which a ring of compliant polymer 602 surrounds part of a die pad 604 to provide cushioning and some flexibility against the interface stress between the metallic pillar 104 and the die 102. A polymer layer 608, such as a B-stage epoxy layer, adheres the metal foil 108 (shown patterned) onto another polymer layer 606. A layer of compliant polymer 610, such as polyimide, has been applied.

The polymer materials used may be heat-resistant to withstand temperatures sometimes achieved in production. Such temperatures may be above 150° C. for 30 minutes or more. For example, a polymeric system described by Rimdusit and Ishida, based on a ternary mixture of benzoxazine, epoxy, and phenolic novolac resins may be used as a polymer material 606, to provide thermal stability at only a 5% weight loss at temperatures up to 370° C. These materials are described in "Development of new class of electronic packaging materials based on ternary systems of benzoxazine, epoxy, and phenolic resins," S. Rimdusit and H. Ishida, Polymer, Volume 41, Issue 22, October 2000, pages 7941-7949.

Lithography of the polymer layer 606 (or 210 & 310 in FIGS. 2 & 3) may be adjusted to create holes or voids 612 of a predetermined size, which may be filled with the compliant polymer 610 during application of the compliant polymer layer 610 to provide a stress relief buffer zone between the vertical sidewalls 614 of the voids 612 and vertical sidewalls 616 of the metal pillars 104. The stress relief buffer zone may extend from the outside of a metal pillar 104 for 0.1-50.0 µm in all directions, for example.

Example Method

Figure 7:
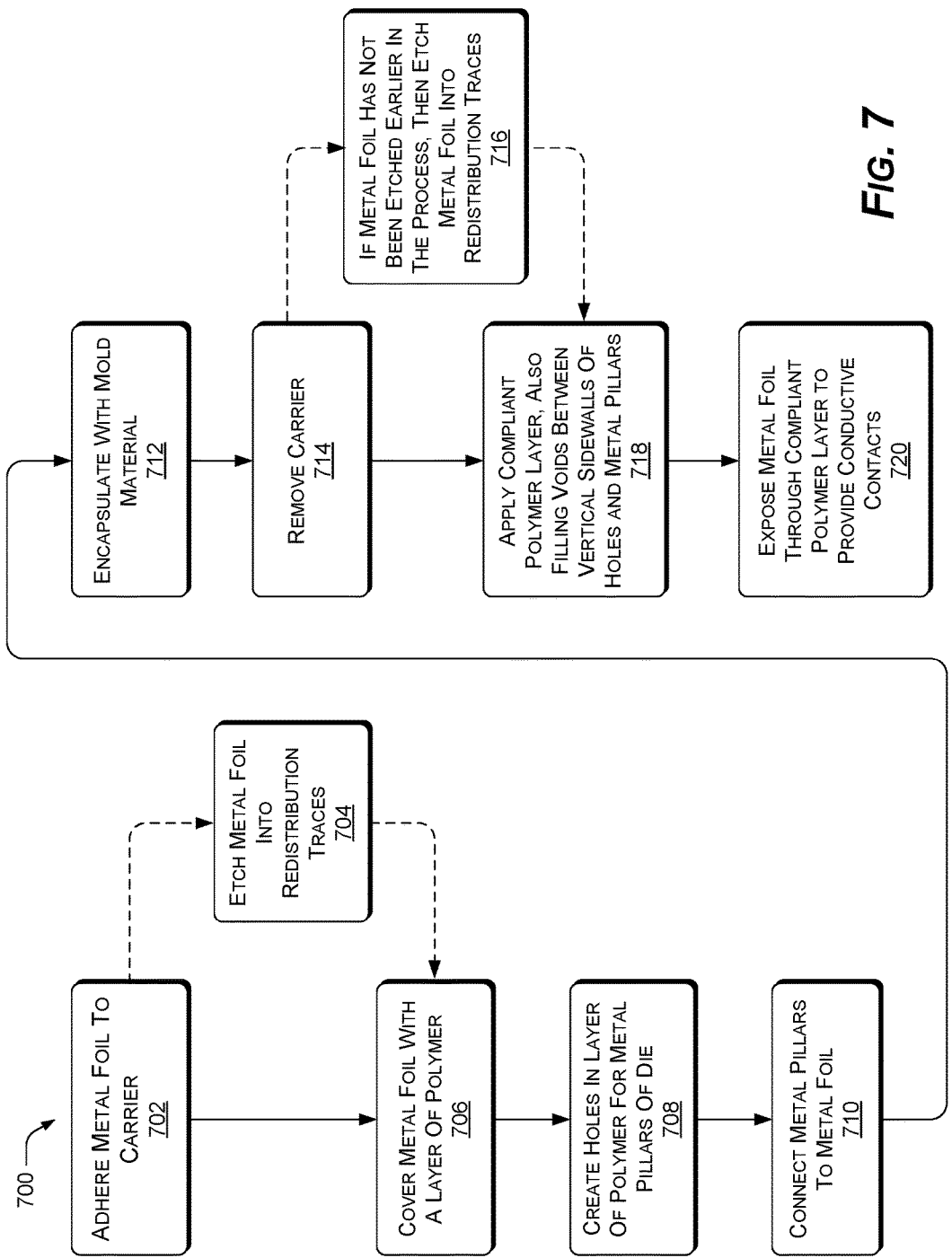
FIG. 7 is a flow diagram of an example method of fabricating a fan-out wafer-level package using metal foil lamination without employing a conventional RDL deposition process.

FIG. 7 shows an example method 700 of fabricating a fan-out wafer-level package using metal foil lamination without a conventional RDL deposition process. In the flow diagram of FIG. 7, operations are shown as individual blocks.

At block 702, a metal foil, such as copper, is adhered to a carrier with an adhesive. A commercial product with thin metal foil adhered to a carrier may also be employed.

At block 704, optionally, the metal foil may be etched at this point into redistribution traces.

At block 706, the metal foil is covered with a layer of polymer.

At block 708, holes are created in the polymer layer for mounting metal pillars of an integrated circuit die to the metal foil.

At block 710, the metal pillars are connected to the metal foil.

At block 712, a mold material is applied to encapsulate the dies and the polymer layer.

At block 714, the carrier and adhesive are removed, revealing a second side of the metal foil.

At block 716, if the metal foil has not been etched into redistribution traces before this point, then the metal foil is now etched.

At block 718, a compliant polymer layer is applied over the second side of the metal foil, also filling gaps and voids between vertical sidewalls of the holes in the polymer layer, and vertical sidewalls of the metal pillars.

At block 720, lithography is applied to the compliant polymer layer to expose parts of the metal foil to be used as conductive contacts. The conductive contacts may be used as bonding pads, e.g., bumped with conductive interconnects, and so forth. For example, various solder interconnects can be placed on the exposed conductive contacts, such as solder spheres, flip chip solder bumps, BGA solder balls, and tall columnar solder connections with or without a flux coating or solder paste deposition. Other wired, foil, or package-on-package connections and vias can also be connected or originated at the exposed conductive contacts.

The above operations may be performed in many different sequences. In some fabrication operations, an etching operation to pattern the metal foil may be performed early or late in the particular process. An optional annealing operation may be added in some implementations, to anneal the metal foil to metal pillars, stub bumps, BVA interconnects, and so forth.

The example method 700 may include an operation of filling voids of predetermined size around at least part of the metal pillars with a cushion of compliant material, such as polyimide or other polymer or dielectric, to reduce mechanical stress between the metal pillars and sidewalls of holes and voids. The metal foil may be a copper or copper laminate of consistent thickness, as compared with conventional RDL deposited conductors, to provide enhanced fidelity of high frequency signals during operation of the wafer-level package.

In the specification and appended claims: the terms "connect", "connection", "connected", "in connection with", and "connecting" are used to mean "in direct connection with" or "in connection with via one or more elements"; and the term "set" is used to mean "one element" or "more than one element". Further, the terms "couple", "coupling", "coupled", "coupled together", and "coupled with" are used to mean "directly coupled together" or "coupled together via one or more elements". As used herein, the terms "up" and "down", "upper" and "lower", "upwardly" and "downwardly", "upstream" and "downstream"; "above" and "below"; and other like terms indicating relative positions above or below a given point or element are used in this description to more clearly describe some embodiments of the disclosure.

While the present disclosure has been disclosed with respect to a limited number of embodiments, those skilled in the art, having the benefit of this disclosure, will appreciate numerous modifications and variations there from. It is intended that the appended claims cover such modifications and variations as fall within the true spirit and scope of the disclosure.

The invention claimed is:

1. A wafer-level package, comprising:
an integrated circuit die including metallic pillars;
at least a layer of a B-stage material occupying at least part of a volume between the metallic pillars of the integrated circuit die;
predetermined holes in the B-stage material approximating a placement of the metallic pillars;
a patterned metal foil adhered by the B-stage material to the integrated circuit die or to a mold material of the wafer-level package, the metal foil in conductive contact with the metallic pillars;
wherein the metal foil is patterned to create metal traces for relocating conductive contacts fanned in or fanned-out from the metallic pillars; and
wherein the B-stage material comprises a compliant epoxy to reduce an interface stress between the metallic pillars and the integrated circuit die at a fan-out boundary or a fan-in boundary of the wafer-level package.

2. The wafer-level package of claim 1, wherein the metal foil comprises a metal laminate sheet.

3. A wafer-level package, comprising:
an integrated circuit die including metallic pillars;
at least a layer of a B-stage material occupying at least part of a volume between the metallic pillars of the integrated circuit die;
holes in the B-stage material approximating a placement of the metallic pillars;
a patterned metal foil adhered by the B-stage material to the integrated circuit die or to a mold material of the wafer-level package, the metal foil in conductive contact with the metallic pillars;
wherein the metal foil is patterned to create metal traces for relocating conductive contacts fanned in or fanned-out from the metallic pillars;
a compliant polymer layer over the patterned metal foil;
a compliant polymer of the compliant polymer layer also comprising a mechanical stress buffer between sidewalls of one or more of the metallic pillars and sidewalls of a hole in the B-stage material surrounding the one or more metallic pillars;
the compliant polymer filling gaps between the one or more of the metallic pillars and the sidewalls of the hole, the compliant polymer filing gaps in the range of 0.1-50.0 µm; and
wherein each hole comprises a circular, oval, square, or rectangular cross-section.

4. The wafer-level package of claim 3, wherein the compliant polymer comprises a polymer selected from the group consisting of a polyimide, a polymer with a Young's Modulus or tensile modulus less than 4.0 GPa (gigapascals), and a dielectric with a Young's Modulus or tensile modulus less than 4.0 GPa.

5. A wafer-level fabrication process, comprising:
selecting a die including metal pillars of an integrated circuit;
incorporating the selected die in a wafer-level package;
adhering a metal foil to the wafer-level package via a polymer to create conductive contacts between the metal foil and the metal pillars;
after adhering the metal foil via the polymer, encasing at least part of the die in a molding material;
patterning the metal foil to create metal traces for fanning out conductive contacts corresponding to the metal pillars; and
filling voids of predetermined size around at least part of the metal pillars with a cushion material to reduce a mechanical stress between the metal pillars and the die, wherein a stress-relief zone provided by the cushion material extends radially outward in a ring or cylinder from an outer surface of each metal pillar for a distance in the range of 0.1-50.0 µm.

6. The wafer-level fabrication process of claim 5, wherein the metal foil comprises copper (Cu) of a consistent thickness capable of enhancing fidelity of high frequency signals during operation.

* * * * *